(12) United States Patent
Maffeis

(10) Patent No.: US 9,715,908 B2
(45) Date of Patent: Jul. 25, 2017

(54) CONTROLLER FOR A SOLID-STATE DRIVE, AND RELATED SOLID-STATE DRIVE

(71) Applicant: NandEXT S.r.l., Località Dogana (SM)

(72) Inventor: Margherita Maffeis, Dalmine (IT)

(73) Assignee: NandEXT Srl (SM)

( * ) Notice: Subject to any disclaimer, the term of this patent is extended or adjusted under 35 U.S.C. 154(b) by 47 days.

(21) Appl. No.: 14/789,518

(22) Filed: Jul. 1, 2015

(65) Prior Publication Data
US 2017/0004059 A1 Jan. 5, 2017

(51) Int. Cl.
*G11C 29/00* (2006.01)
*G11C 7/10* (2006.01)
*G11C 11/56* (2006.01)
*G11C 16/10* (2006.01)
*G11C 16/34* (2006.01)

(52) U.S. Cl.
CPC ........ *G11C 7/1006* (2013.01); *G11C 11/5628* (2013.01); *G11C 16/10* (2013.01); *G11C 16/3495* (2013.01); *G06F 2201/805* (2013.01); *G06F 2201/85* (2013.01)

(58) Field of Classification Search
CPC ............. G06F 11/1072; G06F 11/1004; G06F 11/2094; G11C 7/1006; G11C 11/5628
See application file for complete search history.

(56) References Cited

U.S. PATENT DOCUMENTS 8,327,246 B2 * 12/2012 Weingarten ......... G06F 11/1072
  714/790
8,819,503 B2 * 8/2014 Melik-Martirosian G06F 11/3034
  714/704

* cited by examiner

*Primary Examiner* — Shelly A Chase
(74) *Attorney, Agent, or Firm* — Janeway Patent Law PLLC

(57) ABSTRACT

A controller for a solid state drive is proposed. The solid state drive comprises a plurality of memory cells each one storing a symbol among a plurality of possible symbols. Each bit of each symbol is associated with a respective memory page. The controller comprises
a spreading unit configured to
mark a memory page whose bit error rate overruns an admitted bit error rate as a failed memory page, or as an unfailed memory page otherwise, and to
determine allowed symbols that are allowed to be stored in a group of memory cells associated with the failed memory page. The allowed symbols are a subset of the possible symbols such that the bits of the allowed symbols associated with the unfailed memory pages include all possible bit combinations. The controller comprises
a writing unit configured to write information bits into the group of memory cells according to the allowed symbols.

31 Claims, 9 Drawing Sheets

Figure 1A:
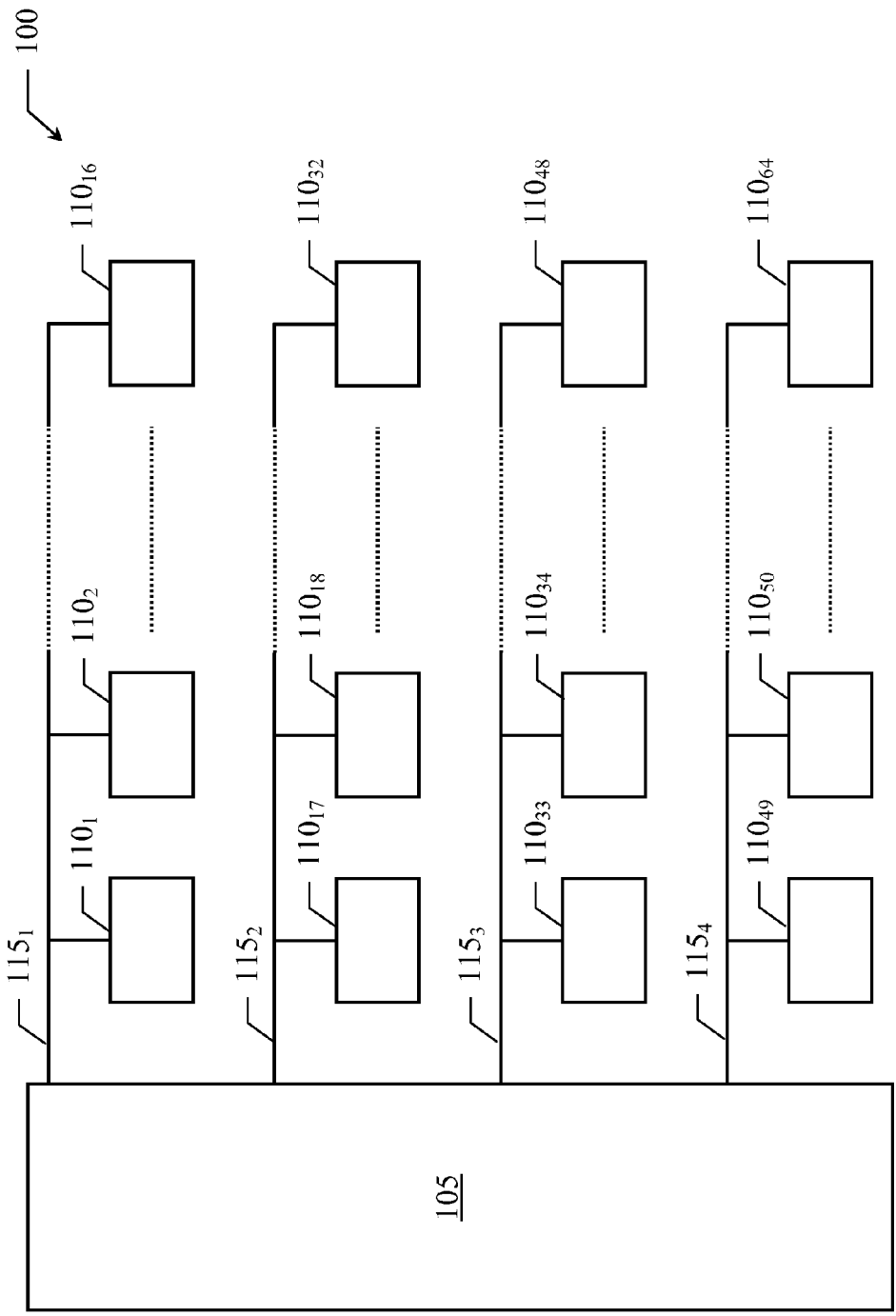

| Cell 0 – D<1,0> | | | |
|---|---|---|---|
| 00 | 01 | 11 | 10 |

Cell 1 – D<3,2>
| 10 | 11 | 01 | 00 |

Figure 4A

| Cell 0 – D<1,0> | | | |
|---|---|---|---|
| 00 | 01 | 11 | 10 |

Cell 1 – D<2>
| 10 | 11 | 01 | 00 |

CONTROLLER FOR A SOLID-STATE DRIVE, AND RELATED SOLID-STATE DRIVE

BACKGROUND OF THE INVENTION

Field of the Invention

The present invention generally relates to "Solid State Drives" (hereinafter, SSD devices), such as SSD devices provided with non-volatile memory chips (e.g., NAND flash memory chips) for storing data.

Overview of the Related Art

SSD devices are nowadays widely used, for example as storage units of computers in replacement of HDD ("Hard Disk Drives").

A common SSD device comprises non-volatile memory chips (for example, NAND flash memory chips) each one including non-volatile memory cells for storing data (bits) even in the absence of external power supply, and a SSD device controller (hereinafter, SSD controller) for managing SSD device operations, such as write/program, erase and read operations.

Each memory cell comprises a floating gate transistor. Each bit or group of bits (identifying a respective logical state of the memory cell) is physically stored in each memory cell in the form of electric charge in the floating gate, which defines a corresponding threshold voltage of the transistor. The number of bits each memory cell is capable of storing depends on memory cell technology. For example, in "Single-Level Cell" (SLC) technology each memory cell (or SLC memory cell) is capable of storing one symbol comprising one bit (i.e. two logical states, 0 or 1, defining two threshold voltages), in "Multi-Level Cell" (MLC) technology each memory cell (or MLC memory cell) is capable of storing one symbol comprising more than one bit, typically two bits (i.e. four logical states, 00, 01, 10, or 11, defining four threshold voltages), whereas in "Tri-Level Cell" technology each memory cell (or TLC memory cell) is capable of storing one symbol comprising three bits (i.e. eight logical states, 000, 001, 010, 011, 100, 101, 110 or 111, defining eight threshold voltages).

While, ideally, all memory cells in a memory chip should feature same (nominal) threshold voltages for same logical states (or, equivalently, for same symbols), practically each threshold voltage associated with a corresponding logical state (or, equivalently, with a corresponding symbol) differs across the memory cells and defines a respective threshold voltage distribution (typically, a Gaussian-type probability distribution), thus resulting in a number of threshold voltage distributions equal to the possible logical states each memory cell can take.

Ideally, the threshold voltage distributions are spaced apart from one another, and a corresponding reference voltage is set between each pair of adjacent threshold voltage distributions for sensing/reading the logical state of the memory cells. This is schematically shown in the top drawing of FIG. 2B for a MLC memory cell and in the top drawing of FIG. 2C for a TCL memory cell.

Figure 2A:
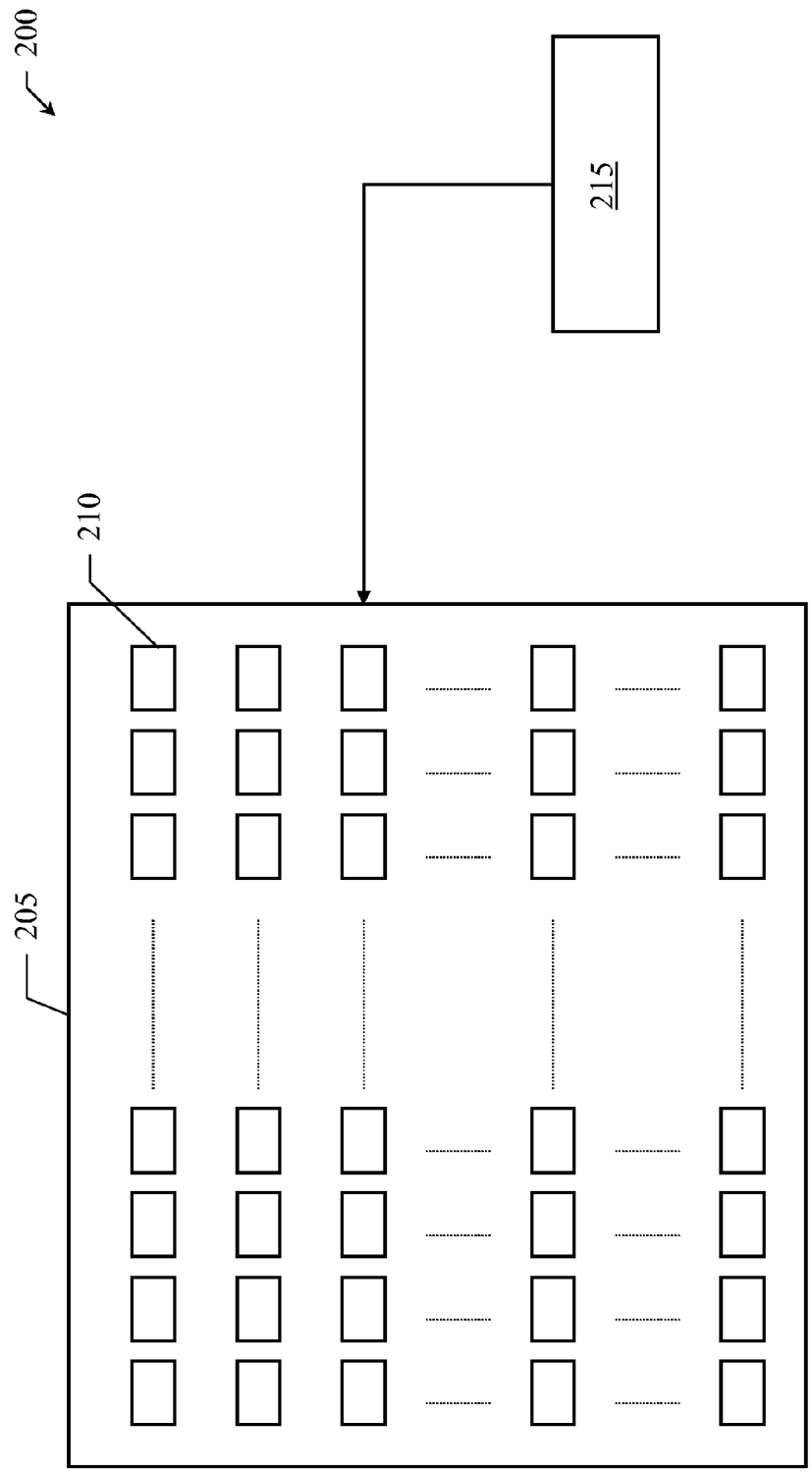
Figure 2B:
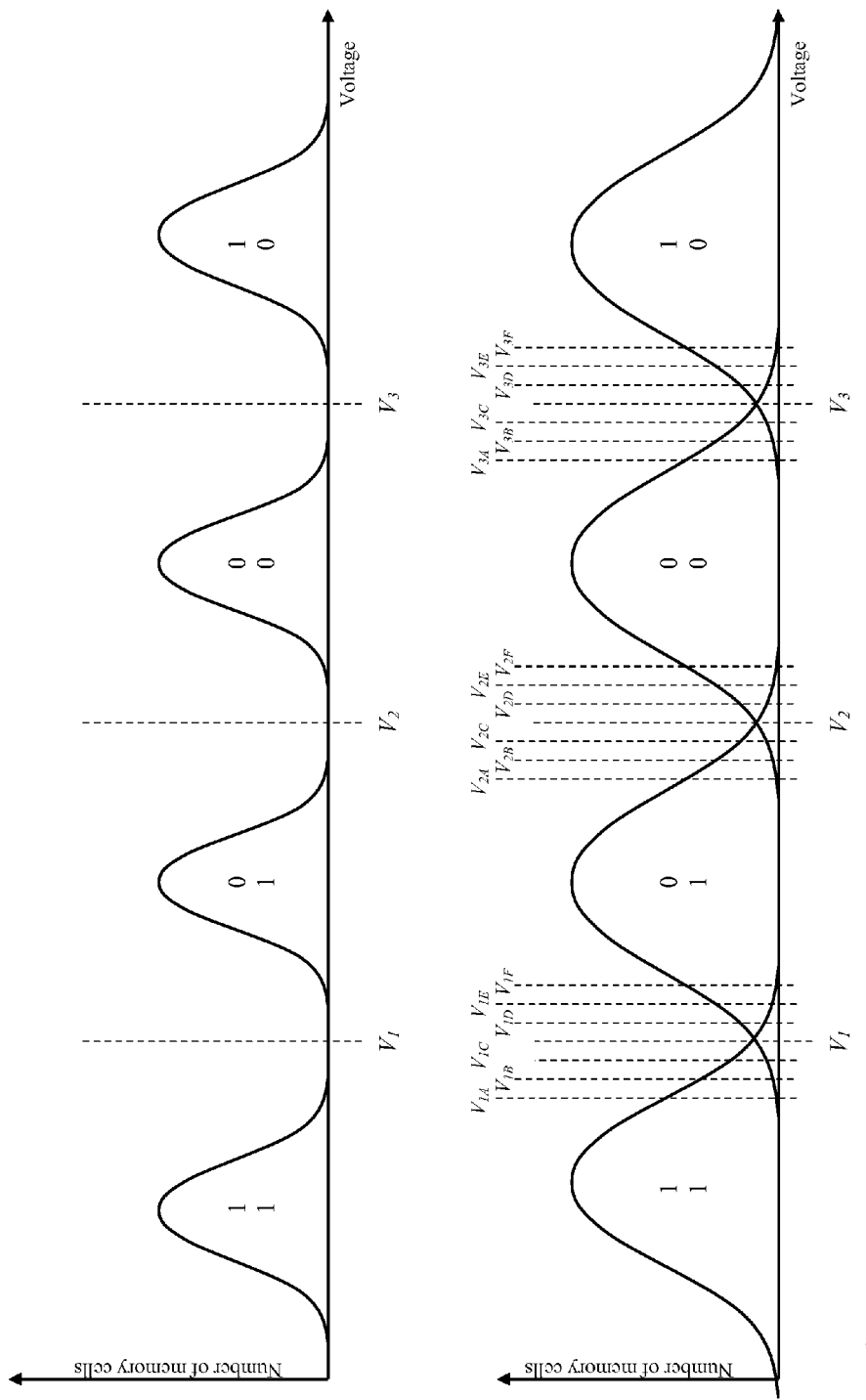
Figure 2C:
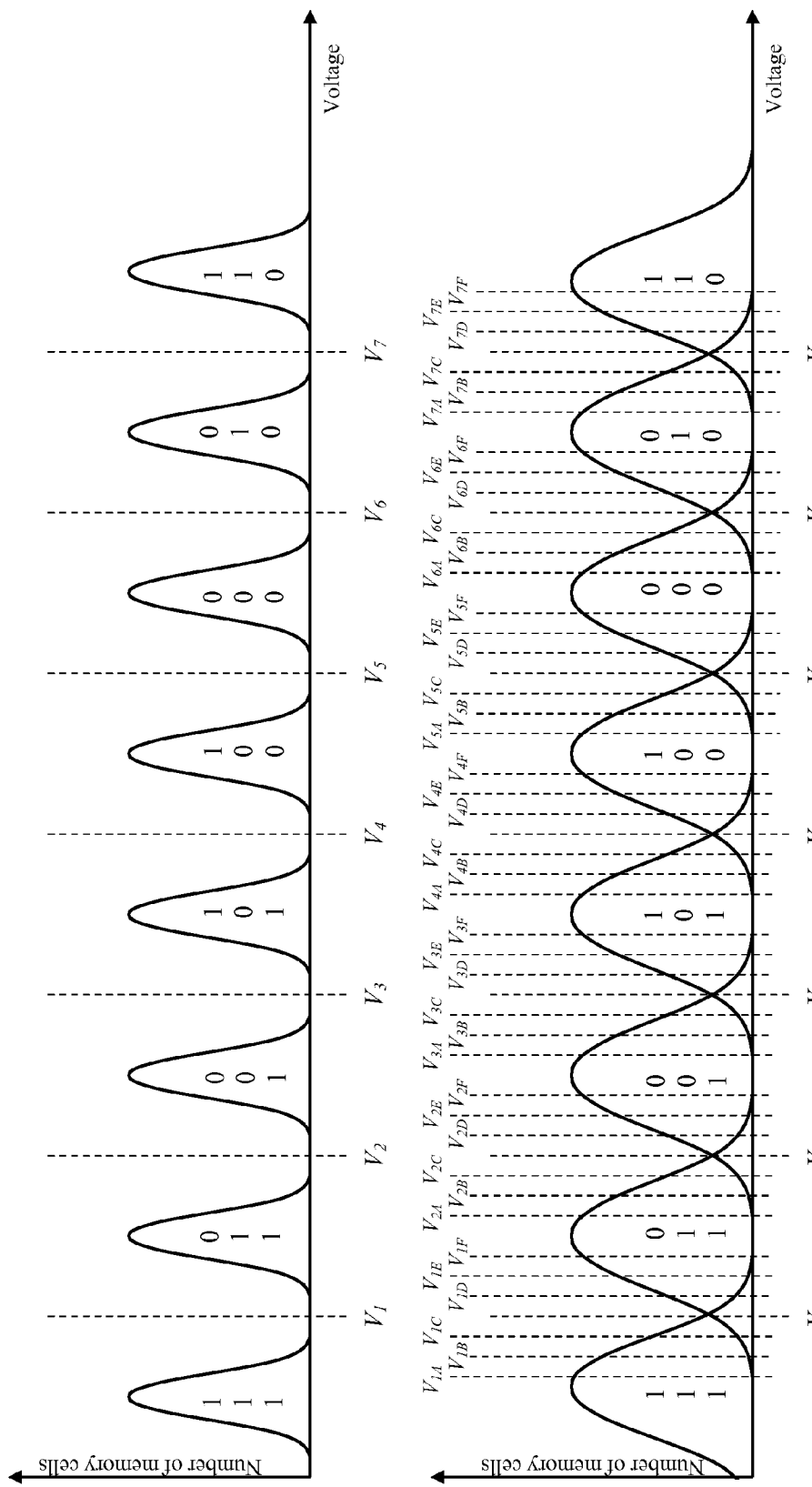

As visible in these drawings, the threshold voltage distributions are (ideally) spaced apart from one another, and a corresponding reference voltage $V_k$ is set between each pair of adjacent threshold voltage distributions for sensing/reading the logical state of the memory cells (k=1, 2, 3 in the example of FIG. 2B and k=1, 2, 3, 4, 5, 6, 7 in the example of FIG. 2C).

In case of the MLC memory cell, during a reading operation a threshold voltage below the reference voltage $V_1$ represents the bit pattern "11", a threshold voltage between the reference voltages $V_1$ and $V_2$ represents the bit pattern "01", a threshold voltage between the reference voltages $V_2$ and $V_3$ represents the bit pattern "00", and a threshold voltage above the reference voltage $V_3$ represents the bit pattern "10".

In case of the TLC memory cell, during a reading operation, a threshold voltage below the reference voltage $V_1$ represents the bit pattern "111", a threshold voltage between the reference voltages $V_1$ and $V_2$ represents the bit pattern "011", a threshold voltage between the reference voltages $V_2$ and $V_3$ represents the bit pattern "001", a threshold voltage between the reference voltages $V_3$ and $V_4$ represents the bit pattern "101", a threshold voltage between the reference voltages $V_4$ and $V_5$ represents the bit pattern "100", a threshold voltage between the reference voltages $V_5$ and $V_6$ represents the bit pattern "000", a threshold voltage between the reference voltages $V_6$ and $V_7$ represents the bit pattern "010", and a threshold voltage above the reference voltage $V_7$ represents the bit pattern "110".

To read a memory cell, the threshold voltage of the memory cell is compared to the reference voltages $V_k$. Typically, reading a memory cell that stores a symbol of m bits requires, for at least one page of memory cells (hereinafter, memory page), m such comparisons.

For example, when m=3, such as in the TLC memory cell, the threshold voltage is first compared to the reference voltage $V_4$. Depending on the outcome of that comparison, the threshold voltage is then compared either to the reference voltage $V_2$ or to the reference voltage $V_6$. Depending on the outcome of the second comparison, the threshold voltage is then compared either to the reference voltages $V_1$ or $V_3$ or to the reference voltages $V_5$ or $V_7$.

However, the increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference and retention noise, which translates into partially overlapping areas of adjacent threshold voltage distributions (shown in the bottom drawings of FIGS. 2B and 2C) and, hence, into the increasing of the number of bit errors.

The increasing number of bit errors strongly reduces SSD device lifetime.

Indeed, the memory cells are typically organized into basic structures referred to as memory sectors or memory pages, which in turn are grouped into memory blocks—each memory block being a group (e.g., 16, 32, 64, or more) of memory pages, the number of memory pages per memory block depending on the specific application—and, according to a conventional SSD device operation, when one or more memory cells of a memory page fail to achieve a number of bit errors lower than an admitted number of bit errors (hereinafter, failed memory cells and failed memory pages), the whole memory block to which that memory page belongs is declared as a failed memory block (i.e. it is made totally unavailable for following write and read operations).

Thus, for each failed memory page, a higher number of memory pages (including both the failed memory page and the unfailed memory pages of the same memory block) are made totally unavailable for following write and read operations, which drastically reduces SSD device lifetime.

In order to compensate for larger bit errors, and to increase SSD device reliability, "Forward Error Correction"

has been proposed (and typically implemented in the SSD controller) for locating and correcting bit errors. According to "Forward Error Correction" principles, the bits to be stored are encoded in a redundant way (e.g., by adding parity bits) by means of an "Error Correction Code" (ECC code), so that redundancy allows detecting a limited number of bit errors that may occur anywhere in the read bits, and to correct these errors without rereading. Generally, the number of detectable and correctable bit errors increases as the number of parity bits in the ECC code increases.

The probability of corrupted read bits, which therefore contains incorrect bits, before correction is referred to as "Raw Bit Error Rate" (RBER). The RBER observed after application of the ECC code is referred to as "Frame Bit Error Rate" (FER), whereas the FER divided by the number of read bits is referred to as "Uncorrectable Bit Error Rate" (UBER).

The acceptable UBER is often dependent upon the application in which the SSD device is intended to be employed. In the case of price sensitive, consumer applications, which experience a relatively low number of accesses (e.g., program/erase cycles), the SSD device may tolerate a higher UBER as compared to a high-end application experiencing a relatively high number of accesses, such as an enterprise application.

SUMMARY OF THE INVENTION

The Applicant has recognized that, even considering "Forward Error Correction", nowadays SSD devices based on failed memory blocks are not satisfactory in terms of lifetime (i.e., sustainable program/erase cycles).

Indeed, nowadays SSD devices are smaller and smaller while featuring increasingly growing bits per memory cell— such as SSD devices based on MLC and TLC technologies, hereinafter MLC and TLC SSD devices. Thus, the resulting narrow distance between the threshold voltage distributions makes bit errors more and more likely to overrun "Forward Error Correction" capabilities, and hence not sufficient to significantly slow down SSD device storage capacity reduction due to the failed memory blocks increase over time (i.e., during SSD device operation).

Moreover, the Applicant has also understood that nowadays enterprise MLC and TLC SSD devices are excessively expensive as compared to their performance in terms of lifetime. By way of example only, it could be estimated that an enterprise MLC SSD device cost is seven times higher than a consumer TLC SSD device.

The Applicant has tackled the above-discussed issues, and has devised a SSD controller for obtaining SSD devices having extended lifetime and low costs.

One or more aspects of the present invention are set out in the independent claims, with advantageous features of the same invention that are indicated in the dependent claims, whose wording is enclosed herein verbatim by reference (with any advantageous feature being provided with reference to a specific aspect of the present invention that applies mutatis mutandis to any other aspect thereof).

More specifically, an aspect of the present invention relates to a controller for a solid state drive. The solid state drive comprises a plurality of memory cells, wherein each memory cell can store a symbol among a plurality of possible symbols the memory cell is designed to store, wherein each bit of each symbol is associated with a respective memory page, the memory cells being programmed and read simultaneously at memory page level. The controller comprises:

a spreading unit configured to:

mark a memory page whose bit error rate overruns an admitted bit error rate as a failed memory page, each memory page other than a failed memory page defining an unfailed memory page, and for a first group of memory cells which are associated with the failed memory page, determine first allowed symbols that are allowed to be stored in the first group of memory cells, said first allowed symbols being a subset of the plurality of the possible symbols such that the bits of the first allowed symbols associated with the unfailed memory pages include all possible bit combinations, and a writing unit configured to write information bits into the first group of memory cells according to the first allowed symbols.

According to an embodiment of the present invention, each memory cell comprises a floating gate transistor for storing a symbol when programmed with a threshold voltage associated with that symbol, and each threshold voltage is variable over the memory cells of the plurality of memory cells thereby defining a corresponding threshold voltage distribution. Said first allowed symbols are further selected according to a criterion of maximization of distance among the respective threshold voltage distributions.

According to an embodiment of the present invention, the spreading unit is further configured to determine a plurality of allowed symbol combinations each one comprising, for each first allowed symbol, a second allowed symbol that is allowed to be written in a second group of memory cells when the first allowed symbol is written in the first group of memory cells. Each allowed symbol combination is selected such that the bits of the first and second allowed symbols associated with the unfailed memory pages include all possible bit combinations. The writing unit is configured to write the information bits into the first and second groups of memory cells according to said allowed symbol combinations.

According to an embodiment of the present invention, each memory cell comprises a floating gate transistor for storing a symbol when programmed with a threshold voltage associated with that symbol, and each threshold voltage is variable over the memory cells of the plurality of memory cells thereby defining a corresponding threshold voltage distribution, each allowed symbol combination being selected such that said first and second allowed symbols comply with a criterion of maximization of distance among the respective threshold voltage distributions.

According to an embodiment of the present invention, said second group of memory cells comprise memory cells potentially disturbing said first group of memory cells.

According to an embodiment of the present invention, said second group of memory cells comprise memory cells adjacent said first group of memory cells.

According to an embodiment of the present invention, the controller further comprises an encoding unit for encoding the information bits into corresponding encoded bits, said first allowed symbols comprising said encoded bits.

According to an embodiment of the present invention, said encoding unit is based on a "Low Density Parity Check" (LDPC) code.

According to an embodiment of the present invention, said encoding unit is based on a "Quasi-Cyclic Low Density Parity Check" (QC LDPC) code.

According to an embodiment of the present invention, the controller further comprises:

a de-spreading unit configured to read symbols from the first group of memory cells according to each failed memory page thereof, and a control unit configured to command additional reading on the first group of memory cells when at least one read symbol is not among the first allowed symbols.

According to an embodiment of the present invention, the controller further comprises:

a de-spreading unit configured to read symbols from the first group of memory cells according to each failed memory page thereof, a decoding unit configured to decode the read symbols into said information bits, and a control unit configured to provide, for each bit of each read symbol, an indication about the probability of correctness of that bit based on whether the read symbol is among the first allowed symbols or not, said decoding unit being configured to decode the read bits symbols also based on said indication.

According to an embodiment of the present invention, the control unit is further configured to command additional reading on the first group of memory cells when at least one read symbol is not among the first allowed symbols.

According to an embodiment of the present invention, said decoding unit is based on a "Low Density Parity Check" (LDPC) code.

According to an embodiment of the present invention, said decoding unit is based on a "Quasi-Cyclic Low Density Parity Check" (QC LDPC) code.

Another aspect of the present invention relates to a solid state drive. The solid state drive comprises a plurality of memory cells, wherein each memory cell can store a symbol among a plurality of possible symbols the memory cell is designed to store, wherein each bit of each symbol is associated with a respective memory page, the memory cells being programmed and read simultaneously at memory page level. The solid state drive further comprises:

a spreading unit configured to:
mark a memory page whose bit error rate overruns an admitted bit error rate as a failed memory page, each memory page other than a failed memory page defining an unfailed memory page, and for a first group of memory cells associated with the failed memory page, determine first allowed symbols that are allowed to be stored in the first group of memory cells, said first allowed symbols being a subset of the plurality of the possible symbols such that the bits of the first allowed symbols associated with the unfailed memory pages include all possible bit combinations, and a writing unit configured to write information bits into the first group of memory cells according to the first allowed symbols.

According to an embodiment of the present invention, each memory cell comprises a floating gate transistor for storing a symbol when programmed with a threshold voltage associated with that symbol, and each threshold voltage is variable over the memory cells of the plurality of memory cells thereby defining a corresponding threshold voltage distribution. Said first allowed symbols are further selected according to a criterion of maximization of distance among the respective threshold voltage distributions.

According to an embodiment of the present invention, the spreading unit is further configured to determine a plurality of allowed symbol combinations each one comprising, for each first allowed symbol, a second allowed symbol that is allowed to be written in a second group of memory cells when the first allowed symbol is written in the first group of memory cells. Each allowed symbol combination is selected such that the bits of the first and second allowed symbols associated with the unfailed memory pages include all possible bit combinations. The writing unit is configured to write the information bits into the first and second groups of memory cells according to said allowed symbol combinations.

According to an embodiment of the present invention, each memory cell comprises a floating gate transistor for storing a symbol when programmed with a threshold voltage associated with that symbol, and each threshold voltage is variable over the memory cells of the plurality of memory cells thereby defining a corresponding threshold voltage distribution, each allowed symbol combination being selected such that said first and second allowed symbols comply with a criterion of maximization of distance among the respective threshold voltage distributions.

According to an embodiment of the present invention, said second group of memory cells comprise memory cells potentially disturbing said first group of memory cells.

According to an embodiment of the present invention, said second group of memory cells comprise memory cells adjacent said first group of memory cells.

According to an embodiment of the present invention, the solid state drive further comprises an encoding unit for encoding the information bits into corresponding encoded bits, said first allowed symbols comprising said encoded bits.

According to an embodiment of the present invention, said encoding unit is based on a "Low Density Parity Check" (LDPC) code.

According to an embodiment of the present invention, said encoding unit is based on a "Quasi-Cyclic Low Density Parity Check" (QC LDPC) code.

According to an embodiment of the present invention, the solid state drive further comprises:

a de-spreading unit configured to read symbols from the first group of memory cells according to each failed memory page thereof, and a control unit configured to command additional reading on the first group of memory cells when at least one read symbol is not among the first allowed symbols.

According to an embodiment of the present invention, the solid state drive further comprises:

a de-spreading unit configured to read symbols from the first group of memory cells according to each failed memory page thereof, a decoding unit configured to decode the read symbols into said information bits, and a control unit configured to provide, for each bit of each read symbol, an indication about the probability of correctness of that bit based on whether the read symbol is among the first allowed symbols or not, said decoding unit being configured to decode the read bits symbols also based on said indication.

According to an embodiment of the present invention, the control unit is further configured to command additional reading on the first group of memory cells when at least one read symbol is not among the first allowed symbols.

According to an embodiment of the present invention, said decoding unit is based on a "Low Density Parity Check" (LDPC) code.

According to an embodiment of the present invention, said decoding unit is based on a "Quasi-Cyclic Low Density Parity Check" (QC LDPC) code.

According to an embodiment of the present invention, said memory cells are non-volatile memory cells.

According to an embodiment of the present invention, said memory cells are flash memory cells.

According to an embodiment of the present invention, said memory cells are NAND flash memory cells.

BRIEF DESCRIPTION OF THE ANNEXED DRAWINGS

Figure 1B:
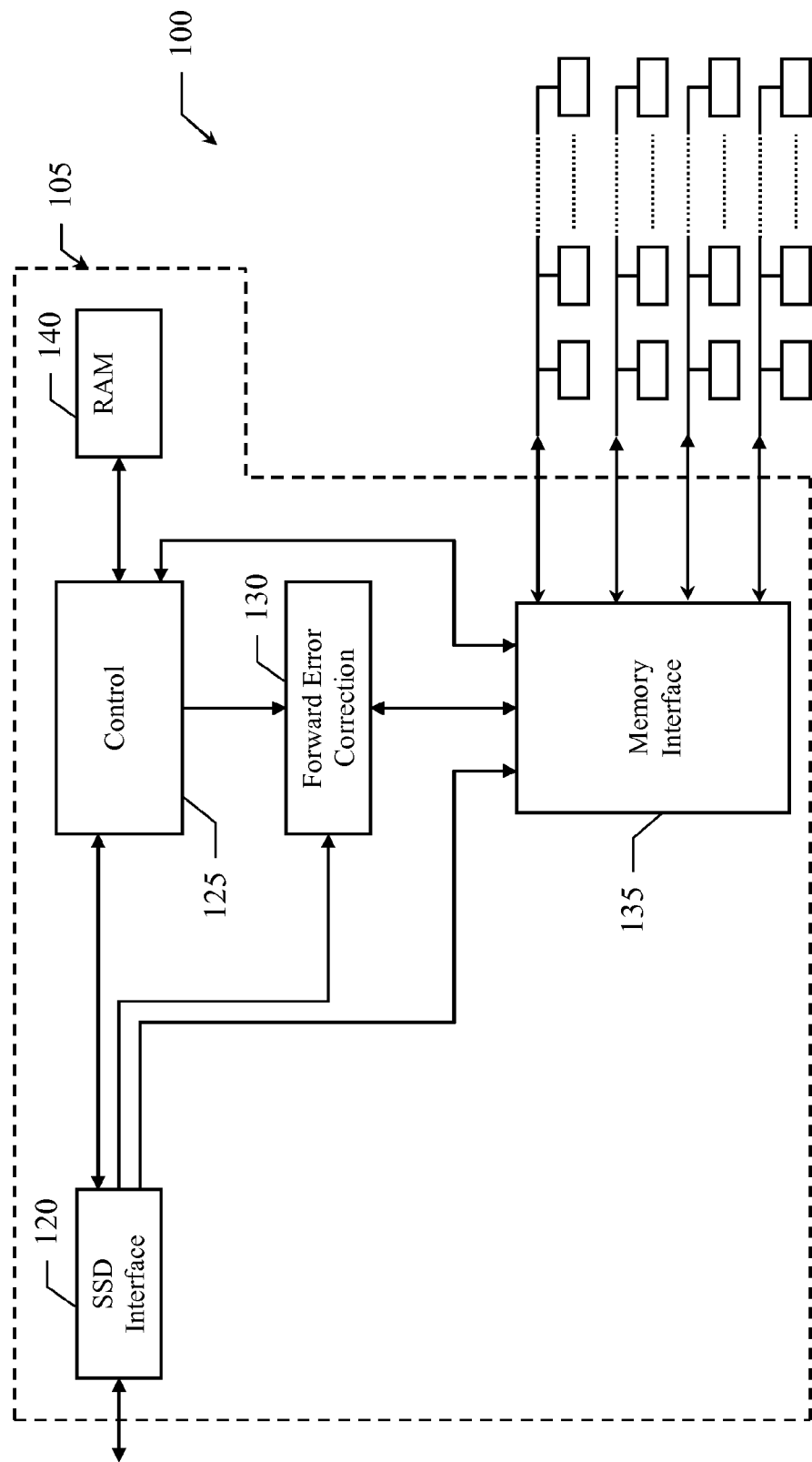
Figure 3A:
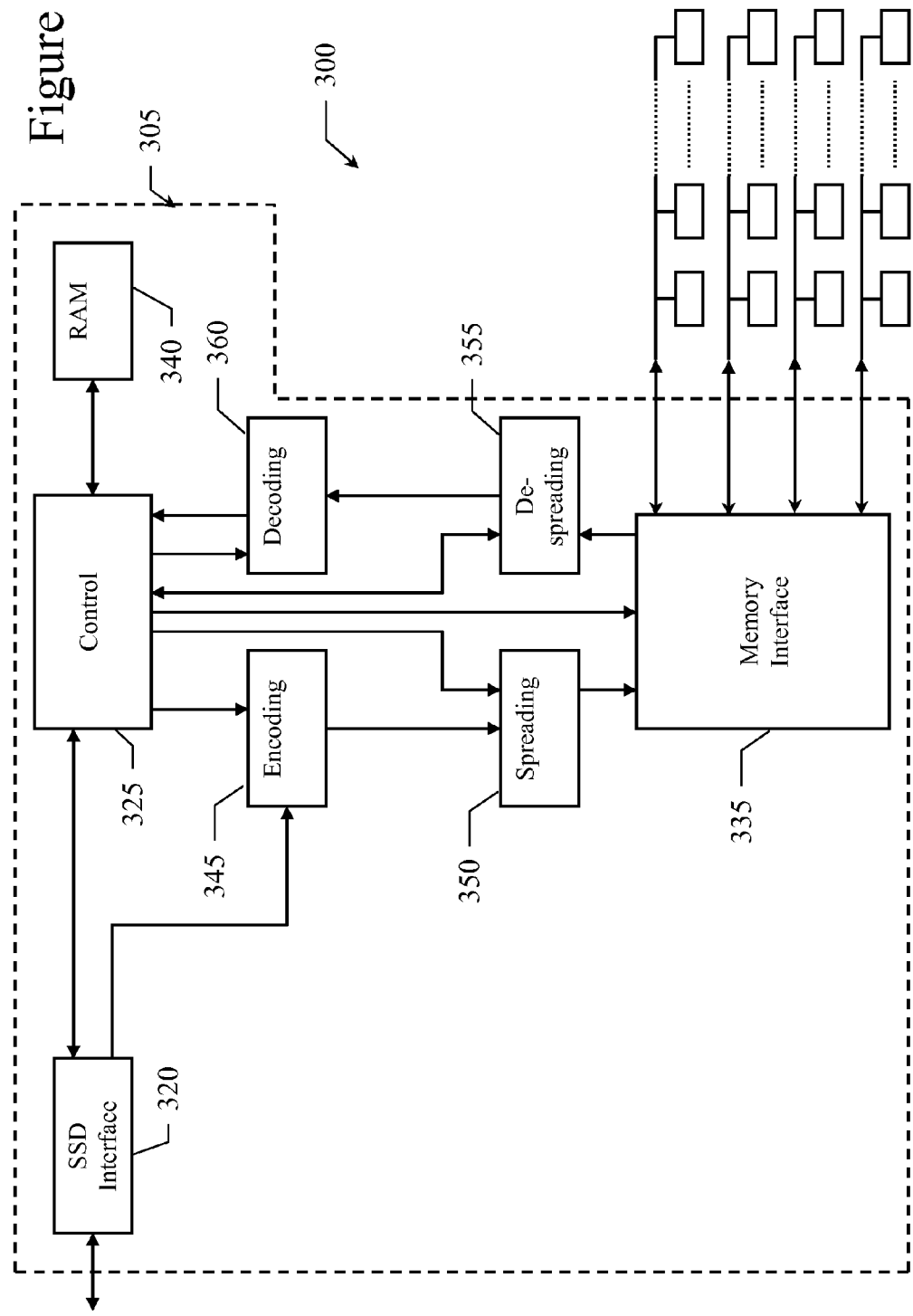
Figure 3B:
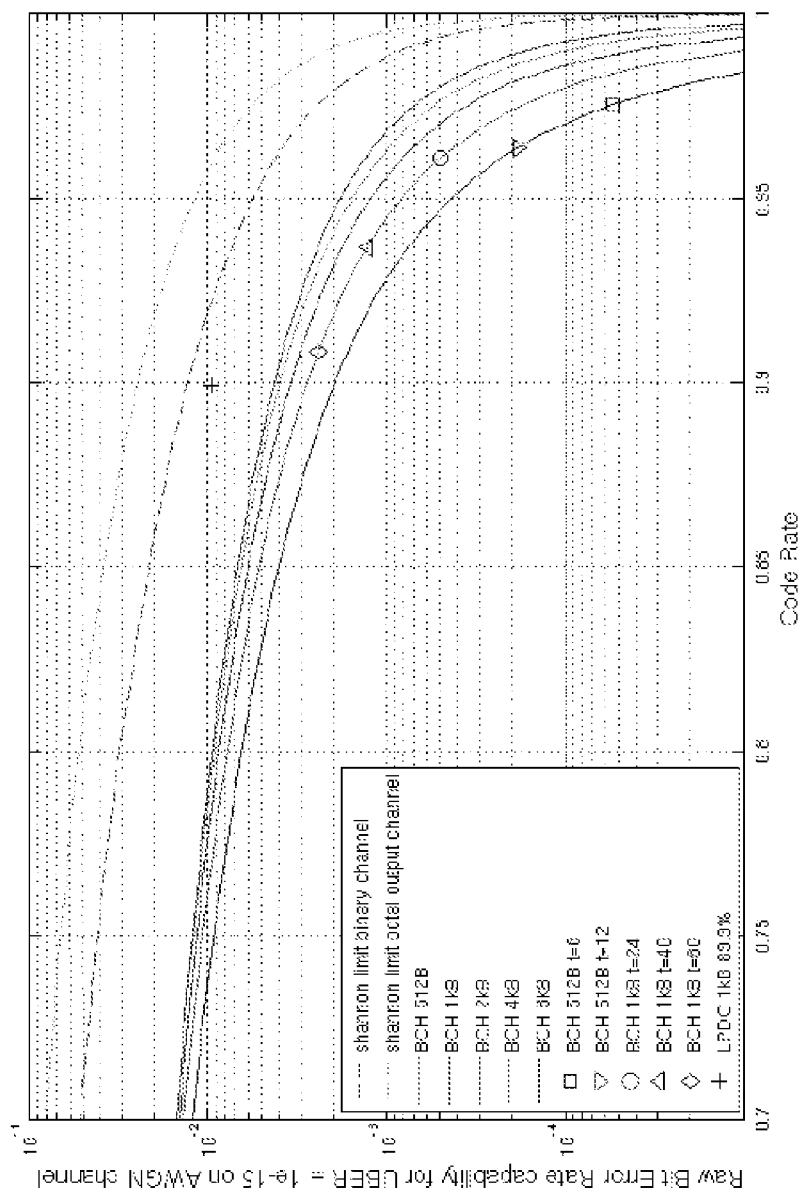

These and other features and advantages of the present invention will be made apparent by the following description of some exemplary and non-limitative embodiments thereof For its better intelligibility, the following description should be read making reference to the attached drawings, wherein:

FIG. 1A schematically shows a simplified architecture of a SSD device known in the state of the art;

FIG. 1B schematically shows a simplified architecture of a typical SSD controller of said SSD device;

FIG. 2A schematically shows a simplified architecture of a typical flash memory die of said SSD device;

FIGS. 2B and 2C schematically show exemplary ideal and real threshold voltage distributions of MLC memory cells and of TLC memory cells, respectively, of said flash memory die;

FIG. 3A schematically shows a simplified architecture of a SSD controller according to the present invention;

FIG. 3B shows a diagram of "Raw Bit Error Rate" capability, with respect to code rate, of some exemplary ECC codes, including a "Low Density Parity Check" code that can be used in the "Forward Error Correction" unit of the SSD controller of FIG. 3A, and FIGS. 4A-4D conceptually show, for two MLC memory cells, corresponding steps of a spreading scheme of a spreading unit of the SSD controller of FIG. 3A according to an embodiment of the present invention.

DETAILED DESCRIPTION OF PREFERRED EMBODIMENTS OF THE INVENTION

With reference to the drawings, FIG. 1A schematically shows a simplified architecture of a "Solid State Drive" device (SSD device) 100 known in the state of the art.

The SSD device 100 preferably comprises a controller (e.g., a processor and/or other control circuitry, referred to herein as SSD controller) 105, a plurality of non-volatile memory chips (e.g. flash memory chips, such as NAND flash memory chips) $110_i$ for storing bits even in the absence of external power supply (i=1, 2, 3, ..., I, with I=64 in the example at issue), and a plurality of (e.g., synchronous and/or asynchronous) channels $115_j$ (j=1, 2, 3, ..., J, with J=4 in the example at issue) communicably coupling the SSD controller 105 and the memory chips $110_i$ to each other—in the exemplary illustration, each channel 115 communicably couples the SSD controller 105 to a set of 16 memory chips $110_i$ (e.g., with the channels $115_1$, $115_2$, $115_3$ and $115_4$ that communicably couple the SSD controller 105 to the memory chips $110_1$-$110_{16}$, $110_{17}$-$110_{32}$, $110_{33}$-$110_{48}$ and $110_{49}$-$110_{64}$, respectively).

With reference also to FIG. 1B, it schematically shows, in terms of operating units, a simplified architecture of a typical SSD controller 105—the term "unit" being herein intended to emphasize functional (rather than implementation) aspects thereof. For the sake of completeness, such a figure also shows, with a smaller size, the memory chips $110_i$ and the channels 115 (the memory chips and the channels being unnumbered in such a figure for ease of illustration).

The SSD controller 105 comprises a SSD interface unit 120 allowing data exchange (i.e., data sending and reception in a bi-directional way) between the SSD device 100 and a host (e.g., a host system such as a personal laptop computer, a desktop computer, a digital camera, a mobile telephone, or a memory card reader, not shown) having compatible receptors for the SSD interface unit 120. The SSD interface unit 120 may be in the form of a standardized interface. For example, when the SSD device 100 is used for data storage in a computing system, the SSD interface unit 120 can be a "Serial advanced technology attachment" (SATA), a "Peripheral Component Interconnect express" (PCIe), or a "Universal Serial Bus" (USB).

Data exchanged between the SSD device 100 (through the SSD interface unit 120 of the SSD controller 105) and the host may comprise, but are not limited to, information bits to be stored (i.e., the information bits to be written in the memory chips $110_i$), read information bits (i.e., the information bits stored in, and read from, the memory chips $110_i$), user commands indicative of the operations to be performed by the SSD controller 105 on the memory chips $110_i$ (such as write, read, diagnosis operations), and other control signals. For the purposes of the present description, the wording "data exchange", and derivative thereof, will be intended to mean a bi-directional exchange (i.e., sending and reception) of data between two units (although this should not be construed limitatively). This is also conceptually represented in the figure by bi-directional arrow connections between the units.

The SSD controller 105 also comprises a control unit 125 (or more thereof) for managing SSD device 100 operation, such as for receiving and processing the user commands from the SSD interface unit 120, handling bit transport to the memory chips $110_i$ along the channels $115_j$ and bit transport to and from the SSD interface unit 120, and coordinating enabling and/or disabling of the memory chips $110_i$ according to the user commands.

In order to compensate for large "Raw Bit Error Rate" (RBER), and to increase reliability of the SSD device 100, the SSD controller 105 also comprises a "Forward Error Correction" (FEC) unit 130 for locating and correcting bit errors. According to "Forward Error Correction" principles, the information bits to be stored in the memory chips $110_i$ (and provided either by the control unit 125 or, directly, from the SSD interface unit 105) are encoded in a redundant way (e.g., by adding parity bits) by means of an "Error Correction Code" (ECC code), so that redundancy allows detecting a limited number of bit errors that may occur anywhere in the read bits, and to correct these errors, during decoding, without rereading. The FEC unit 130 may comprise discrete components—such as an "Application Specific Integrated Circuit" (ASIC)—external to the control unit 125 (as herein assumed by way of example only), or the FEC unit 130 may reflect functionalities that do not necessarily have a discrete physical form separate from the control unit 125.

In order to ease bits transport between the SSD controller 105 and the memory chips $110_i$ along the respective channels $115_j$, the SSD controller 105 comprises one (as herein exemplary illustrated) or more memory interface units 135—alternatively, a memory interface unit 135 for each channel $115_j$ can be provided, or a memory interface unit 135 for each memory chip $110_i$, or for each group of memory chips $110_i$ can be provided.

As conceptually depicted in the figure by (unidirectional or bi-directional) arrow connections, which however should not be construed limitatively, the memory interface unit 135 is communicably coupled in a unidirectional manner to the SSD interface 120 (e.g., for receiving from it the information bits to be written when no ECC code is requested), and in a bi-directional manner to the control unit 125 (e.g., for receiving control information from it, such as an indication of the memory chips $110_i$ to be enabled for write or read operations, and for providing to it the read bits to be transmitted to the SSD interface unit 120) and to the FEC unit 130 (for example, for receiving encoded bits from it, e.g. including the information and parity bits, and for providing to it the read bits to be decoded before transmitting to the control unit 125, and hence to the SSD interface unit 120, the read information bits).

The SSD controller 105 further comprises a memory unit (e.g., a "Random Access Memory", RAM) 140 communicably coupled (in a bi-directional manner) to the control unit 125 for receiving and storing statistical information (such as number of program/erase cycles, and number of bit errors) and/or diagnostic information (such as working temperature, power consumption) retrieved and/or calculated by the control unit 125 (e.g. based on SSD device 100 operation and/or on sensors and/or diagnostic circuits within the SSD device 100, not shown), and, when required, for feeding the control unit 125 with the stored information.

A typical flash memory chip $110_i$ may comprise one or more flash memory dice.

A typical flash memory die, illustrated in FIG. 2A and denoted by the number reference 200, comprises one (as depicted) or more memory arrays 205 of memory cells (e.g., NAND flash memory cells) 210 arranged in rows and columns. Each memory array 205 is typically divided into multiple memory pages. Broadly speaking, each memory page comprises a number of memory cells 210 that can be programmed and read simultaneously. A number of memory pages form a memory block, and the size of the memory block equals to the product of the size of the memory page and the total number of memory pages in the memory block.

In some embodiments, each memory page comprises a respective (e.g., entire) row of the memory array 205. In alternative embodiments, each row can be divided into different memory pages, either physically (for example, for each row, a memory page comprising the odd-order memory cells 210 and a memory page comprising the even-order memory cells 210), or (as herein considered and better discussed below) logically (i.e., wherein each memory cell 210 stores respective portions of different memory pages).

Each memory cell 210 comprises a floating gate transistor (not illustrated). Each bit or group of bits (or symbol, or bit pattern) identifying a respective logical state of the memory cell 210 is physically stored in each memory cell 210 in the form of electric charge in the floating gate, which defines a corresponding threshold voltage of the transistor. The number of bits each memory cell 210 is capable of storing depends on memory cell technology. For example, in "Single-Level Cell" (SLC) technology each memory cell (or SLC memory cell) is capable of storing one symbol comprising one bit (i.e. two logical states, 0 or 1, defining, i.e. being associated with, one read threshold voltages), in "Multi-Level Cell" (MLC) technology each memory cell (or MLC memory cell) is capable of storing one symbol comprising more than one bit, typically two bits (i.e. four logical states, 00, 01, 10, or 11, defining, i.e. being associated with, three read threshold voltages), whereas in "Tri-Level Cell" technology each memory cell (or TLC memory cell) is capable of storing one symbol comprising three bits (i.e. eight logical states, 000, 001, 010, 011, 100, 101, 110 or 111, defining, i.e. being associated with, seven threshold voltages). In the following, explicit reference will be made to SSD devices having MLC or TLC memory cells (referred to as MLC and TLC SSD devices, respectively), which the present invention is mainly intended to.

While, ideally, all memory cells 210 in the flash memory die 200 should feature same (nominal) threshold voltages for same logical states (or, equivalently, for same symbols), practically each threshold voltage associated with a corresponding logical state (or, equivalently, associated with a corresponding symbol) differs across the memory cells 210 and defines a respective threshold voltage distribution (typically, a Gaussian-type probability distribution), thus resulting in a number of threshold voltage distributions equal to the possible logical states each memory cell 210 can take. This is schematically shown in the top drawing of FIG. 2B for a MLC memory cell and in the top drawing of FIG. 2C for a TCL memory cell.

Ideally, the threshold voltage distributions are spaced apart from one another, and a corresponding reference voltage $V_k$ is set between each pair of adjacent threshold voltage distributions for sensing/reading the logical state of the memory cells 210 (k=1, 2, 3 in the example of FIG. 2B and k=1, 2, 3, 4, 5, 6, 7 in the example of FIG. 2C).

In the case of MLC memory cell, during a reading operation, a threshold voltage below the reference voltage $V_1$ represents the bit pattern "11", a threshold voltage between the reference voltages $V_1$ and $V_2$ represents the bit pattern "01", a threshold voltage between the reference voltages $V_2$ and $V_3$ represents the bit pattern "00", and a threshold voltage above the reference voltage $V_3$ represents the bit pattern "10".

In the case of TLC memory cell, during a reading operation, a threshold voltage below the reference voltage $V_1$ represents the bit pattern "111", a threshold voltage between the reference voltages $V_1$ and $V_2$ represents the bit pattern "011", a threshold voltage between the reference voltages $V_2$ and $V_3$ represents the bit pattern "001", a threshold voltage between the reference voltages $V_3$ and $V_4$ represents the bit pattern "101", a threshold voltage between the reference voltages $V_4$ and $V_5$ represents the bit pattern "100", a threshold voltage between the reference voltages $V_5$ and $V_6$ represents the bit pattern "000", a threshold voltage between the reference voltages $V_6$ and $V_7$ represents the bit pattern "010", and a threshold voltage above the reference voltage $V_7$ represents the bit pattern "110".

To read a memory cell 210, the threshold voltage of the memory cell 210 is compared to the reference voltages $V_K$. According to an embodiment, reading a memory cell 210 that stores a bit pattern of m bits requires, for at least one page of memory cells (hereinafter, memory page), m such comparisons.

For example, when m=3, such as in the TLC memory cell, the threshold voltage is first compared to the reference voltage $V_4$. Depending on the outcome of that comparison, the threshold voltage is then compared either to the reference voltage $V_2$ or to the reference voltage $V_6$. Depending on the outcome of the second comparison, the threshold voltage is then compared either to the reference voltages $V_1$ or $V_3$ or to the reference voltages $V_5$ or $V_7$.

The two bits stored in a MLC memory cell are usually referred to as "Least Significant Bit" (LSB bit) and "Most Significant Bit" (MSB bit)—with reference to the conceptual representation of vertically arranged symbol associated with the respective threshold voltage distribution, the LSB and MSB bits are assumed to be the bottom and top bits, respectively—whereas the three bits stored in a TLC memory cell are usually referred to as "Least Significant Bit" (LSB bit), "Center Significant Bit" (CSB bit) and "Most Significant Bit" (MSB bit)—with reference to the conceptual representation of vertically arranged symbol associated with the respective threshold voltage distribution, the LSB, CSB and MSB bits are assumed to be the bottom, central and top bits, respectively. The terms LSB, CSB and MSB are used only as a reference to specific bits within the memory cell, and do not imply that certain bits are more important than others (in this respect, any other suitable terminology can also be used).

According to a typical implementation herein assumed, different bits in a given group of memory cells 210 correspond to different memory pages.

For example, a group of eight-logical states (TLC) memory cells 210 can be used for storing three memory pages, a first page in the LSB bits of the memory cells of the group (thus referred to as LSB page), a second page in the CSB bits of the memory cells of the group (thus referred to as CSB page), and a third page in the MSB bits of the memory cells of the group (thus referred to as MSB page). Similarly, a group of four-logical states (MLC) memory cells can be used for storing LSB and MSB pages.

Back to FIG. 2A, the memory die 200 preferably comprises reading/writing unit (e.g. including decoders, multiplexers, drivers, buffers, sense amplifiers), which, being not relevant for the present description, are represented in the figure by means of a single functional block (denoted by the number reference 215). Such a reading/writing unit 215 is configured, in general, for accessing selected (pages of) memory cells (as conceptually represented in the figure by arrow connection between the reading/writing unit 215 and the memory array 205) and for running selected operations thereon (e.g. write, read, diagnosis operations).

The increasing of the number of bits per memory cell causes, for a same threshold voltage distribution space (i.e., for the same allowed maximum and minimum threshold voltages), a higher number of threshold voltage distributions. A higher number of threshold voltage distributions in the same threshold voltage distribution space results in threshold voltage distributions that are closer to each other. This makes the memory cells more prone to suffer severe cell-to-cell interference, mainly arising from floating gate coupling effect between a target memory cell (i.e., a memory cell to be read or written) and the surrounding memory cells, and retention noise, i.e. a loss of the capability of the memory cells to retain the stored bits over time caused by progressive damage of the oxide layer (due to the high electrical fields applied at each program/erase operation) that determines an undesired flow of electrons away/in the floating gate.

Cell-to-cell interference and retention noise translate into partially overlapping areas of adjacent threshold voltage distributions (shown in the bottom drawings of FIGS. 2B and 2C) and, hence, into increasing of the number of bit errors per unit time (referred to as "Raw Bit Error Rate" or RBER).

With reference now to FIG. 3A, it schematically shows, in terms of operating units, a simplified architecture of a SSD controller 305 according an embodiment the present invention. For the sake of completeness, such a figure also shows, in a smaller size, the memory chips $110_i$ and the channels $115_j$ (equivalent to those illustrated in the previous figures), which identify, together with the SSD controller 305, a SSD device 300. Similarly to the above, the term "unit" is herein intended to emphasize functional (rather than implementation) aspects thereof. Indeed, without losing of generality, each unit of the SSD controller 305 may be physically implemented by software, hardware, and/or a combination thereof, and/or within any pre-existing or dedicated entity. In this respect, the operating units are also intended to represent corresponding method steps of a method according to the present invention.

As visible in the figure, the SSD controller 305 comprises, similarly to the SSD controller 105, a SSD interface 320, a SSD control unit 325, a memory interface unit 335, and a memory unit 340, which will not be discussed again for the sake of conciseness.

The SSD controller 305 also comprises an encoding unit 345 for encoding the bits to be stored in the memory array 205 (i.e., the information bits) by means of an ECC code. According to an embodiment of the present invention, the encoding unit 345, and the respective decoding unit (discussed in the following), are implemented in the FEC unit 130.

Preferably, the ECC code is an ECC code allowing soft decoding—or, otherwise stated, an ECC code that allows determining each bit value (hard decoding) as well as each bit reliability in terms of soft bits. Any ECC code may be envisaged without affecting the principles of the present invention, such as "Bose-Chaudhuri-Hocquenghem" (BCH) code, Turbo code, or "Low-Density Parity-Check" (LDPC) code.

According to a preferred embodiment of the present invention, the ECC code is a LDPC code—hence, the encoding unit 345 will be referred to as LDPC encoding unit 345 and the corresponding encoded bits will be referred to as LDPC encoded bits, although this should not be construed limitatively.

LDPC code is a linear ECC code (constructed by using a sparse bipartite graph) that allows transmitting data over a noisy channel. LDPC code is a capacity-approaching code, which means that practical constructions exist that allow the noise threshold to be set very close to the theoretical maximum (the Shannon limit given by the Shannon theorem) for a symmetric memory-less channel.

The Shannon theorem specifies the maximum rate at which data can be transmitted over a channel of a specified bandwidth in the presence of noise. More specifically, according to the Shannon theorem, a bound on the maximum amount of error-free data that can be transmitted with a specified bandwidth in the presence of the noise interference is set, assuming that the signal power is bounded, and that the Gaussian noise process is characterized by a known power or power spectral density. The noise threshold defines an upper bound for the channel noise, up to which the probability of data errors can be made as small as desired.

Thanks to soft decoding allowed by LDPC code, for a given code rate (i.e., the ratio between the information bits to the (LDPC, in the case at issue) encoding unit and the total number of bits generated by the encoding unit, the total number of bits generated by the encoding unit including the parity bits), LDPC code approaches the Shannon limit more than ECC codes typically used in prior art solutions (such as BCH codes), which translates into area saving while maximizing the probability of accurately recovering the bits after a reading operation.

This is illustrated in FIG. 3B, which shows a diagram of "Raw Bit Error Rate" capability, with respect to code rate, of LDPC code and of different BCH codes. In the figure it is also plotted the Shannon limit.

As visible in the figure, given a code rate of 0.9, LDPC code approaches the Shannon limit more than BCH code, whereas the same RBER can be achieved by means of the BCH code only with a code rate of 0.75 (which implies a 25% area overhead).

According to an embodiment, LDPC is a variable rate LDPC code, so that it may change the code rate depending on the RBER. Advantageously, the variable rate LDPC code is a "Quasi-Cyclic Low Density Parity Check" (QC LDPC) code. Broadly speaking, a QC LDPC code has a parity check matrix that is composed of circulant matrices of the same size. Each circulant matrix is a square matrix wherein each row is one degree of right-cyclic shift of the row above it (so that the first row is also the right-cyclic shift of the last row), and wherein each column is one degree of downward-cyclic shift of the column on the left (so that the first column is also the downward-cyclic shift of the rightmost column).

Thus, by enabling different rows/columns of the circulant matrices, the number of parity bits within the circulant matrices may be kept the same while changing the number of information bits within the circulant matrices, thus implying code rate changing. Alternatively, by splitting the rows and introducing a number of all zero circulant matrices, the number of parity bits within the circulant matrices may be changed, so that the parity check matrix becomes more sparse (and the number of parity bits and information bits, and hence the code rate, is changed).

Back to FIG. 3A, the SSD controller 305 also comprises a mapping unit for mapping the LPDC encoded bits into mapped LDPC encoded bits. The mapped LDPC encoded bits represent the symbols to be stored in a selected group of memory cells (or target memory cells) of the memory chips $110_i$ by means of the memory interface unit 335 and thanks to control unit 325 action that controls addressing of the memory chips $110_i$. Roughly speaking, the mapping operation provides a proper association of each symbol with a respective memory cell of the target memory cells. According to the present invention, said proper association of the symbols with the target memory cells is based on memory page spreading, thus from now on the mapping unit will be referred to as spreading unit (denoted by the number reference 350 in the figure).

Preferably, as also conceptually illustrated by arrow connections between the SSD control unit 325, the encoding unit 345, the spreading unit 350 and the memory interface unit 335, the spreading unit 350 (and, hence, the spreading operation performed by it) can be selectively enabled by the control unit 325, and hence the LDPC encoded bits may be fed directly to the memory interface unit 335 when the spreading unit 350 is disabled. According to an embodiment of the present invention, selective enabling of the spreading unit 350 takes place after a predetermined number of detected failures (e.g., bit errors). Additionally or alternatively, selective enabling of the spreading unit 350 can take place after a predetermined working period of the SSD device 300 from its first use (e.g., after the program/erase cycles stored in the memory unit 340 reaches a predetermined number), e.g. in order to compensate for decreasing performance affecting the SSD device 300 with its use.

Broadly speaking, according to memory page spreading principles, the availability of the memory pages of the SSD device 300 into which the bits are intended to be written is dynamically updated, e.g. progressively partly reduced, according to the detected bit errors. As will be better understood from the following description, progressive partial reduction of the available memory pages avoids that whole memory blocks are declared as totally unavailable (as instead is presently provided by the known solutions), which lengthens the lifetime of the SSD device 300, and, in addition to that, intrinsically allows threshold voltage distributions spacing (so that the overlapping regions are reduced as much as possible thereby ensuring excellent performance in terms of UBER over time). Thus, memory page spreading is based on lengthening the lifetime of the SSD device 300 for the same (or even higher, as discussed below) error correction capabilities.

The SSD controller 305 further comprises de-spreading 355 and LDPC decoding 360 units for carrying out de-spreading and decoding operations to the read bits in order to extract the information bits therefrom (the de-spreading and LDPC decoding operations being substantially reverse operations with respect to the encoding and spreading operations carried out at LDPC encoding 345 and spreading 350 units, respectively).

As mentioned above, reference is made to the scenario wherein each symbol stored in a memory cell (among the possible symbols the memory cell is designed to store) comprises bits associated with different memory pages (with the memory cells that are programmed and read simultaneously at memory page level).

Broadly speaking, when, after a read operation, the RBER of a memory page overruns the admitted RBER, the spreading unit 350 is configured for:

marking that memory page as a failed memory page and the associated bit as a failed bit (each memory page other than a failed memory page defining an unfailed memory page), and for the memory cells associated with the failed memory page, determining allowed symbols that are allowed to be written/stored in those memory cells. The allowed symbols are a subset of the possible symbols so that at least one forbidden symbol not allowed to be written (in the following program/erase cycles) in those memory cells is defined among the possible symbols. Moreover, the allowed symbols are selected such that the bits of the allowed symbols associated with the unfailed memory pages (also referred to as unfailed bits) include all possible bit combinations, thereafter the information bits can be written into those memory cells according to the allowed symbols.

Thanks to memory page spreading, the lifetime of the SSD device 300 is increased, as the whole memory block to which the failed memory page belongs is not totally unused (as instead is in conventional SSD devices).

Preferably, the allowed symbols are further selected according to a criterion of maximization of distance among the respective threshold voltage distributions. This allows reducing the extent of the overlapping regions among the threshold voltage distributions associated with the allowed symbols, which in turns translates in a lower expected RBER.

These advantages are even more amplified when the memory cells associated with the failed memory page (or first group memory cells) are considered together with other (or second) groups of memory cells of the array, as discussed herebelow. The second group of memory cells may comprise, for example, memory cells potentially disturbing and/or adjacent the first group of memory cells, and may in turn feature one or more failed memory pages.

In such a case, the spreading unit 350 can be further configured to determine allowed symbol combinations each one comprising, for each allowed symbol of the first group of memory cells (or first allowed symbols), a second allowed symbol that is allowed to be written in the second group of memory cells when the first allowed symbol is written in the first group of memory cells. Each allowed symbol combination is preferably selected such that the bits of the first and second allowed symbols associated with the unfailed memory pages include all possible bit combinations (the reading/writing unit being configured to write the information bits into the first and second groups of memory cells according to the allowed symbol combinations).

Advantageously, as discussed above, each allowed symbol combination is selected such that the first and second allowed symbols comply with the criterion of maximization of distance among the respective threshold voltage distributions.

In order to illustrate these concepts, FIG. 3A will be discussed together with FIGS. 4A-4D, the latter conceptually showing, for two MLC memory cells, corresponding steps of a spreading scheme of the spreading unit 350 according to an embodiment of the present invention.

Let be assumed the simplified scenario, illustrated in FIG. 4A, of MLC memory cells (denoted in the figures by Cell 0 and Cell 1, respectively) each one storing two bits of two different memory pages, i.e. the memory pages 0 and 1, denoted by D<1,0> in the figure, whose bits are stored in the memory cell Cell 0 (for example, in the LSB and MSB bits thereof, respectively) as well as in the other memory cells (not shown) of the group of memory cells associated with the memory pages 0 and 1 (i.e., the first group of memory cells), and the memory pages 2 and 3, denoted by D<2,3> in the figure, whose bits are stored in the memory cell Cell 1 (for example, in the LSB and MSB bits, thereof, respectively) as well as in the other memory cells (not shown) of the group of memory cells associated with the memory pages 2 and 3 (i.e., the second group of memory cells).

When the RBER overruns an admitted RBER (or, otherwise stated, the RBER overruns the (fixed) error correction capability of the LDPC decoding unit 360), the memory page wherein bit errors (or most of bit errors) have occurred is marked as a failed memory page, and will be no longer considered in the subsequent program/erase cycles. However, other conditions for marking one or more memory page as failed memory pages may be envisaged, according to specific design needs: by way of example only, when a running time of the LDPC decoding unit 360 is above a predefined running time threshold indicative of an excessive computational effort, and/or after a predetermined number of program/erase cycles have occurred (in both cases the memory page/pages to be marked as failed memory page/pages can be determined randomly or according to statistical information about the memory pages, for example also stored in the memory unit 340). For example, such a statistical information may take into account that, by construction, the number of program/erase cycles possible for each memory block is limited before its performance characteristics begin to deteriorate (e.g., a typical conventional memory block of MLC memory cells may be erased about 10,000 times before being regarded as "exhausted").

In FIG. 4B, the memory page 3 (stored in the MSB bits of the group of memory cells including the memory cell Cell 1, i.e. the second group of memory cells) has been assumed to be affected by most of bit errors, has been marked as a failed memory page and is no longer available for subsequent program/erase cycles. Otherwise stated, the group of memory cells associated with the failed memory page (the memory page 3 in the example at issue) are considered available to program/erase cycles only for the other (or non-failed) memory page (the memory page 2 in the example at issue), i.e. for the memory cells of the second group of memory cells only the bits carrying the information of the non-failed memory page (i.e. the unfailed bits, the LSB bits in the example at issue) will considered valid information.

In the example herein considered of MLC memory cells, this equals to say that the group of MLC memory cells associated with the failed memory page are dealt as SLC memory cells, as only the LSB bits are considered as valid information. However, practically, the MLC memory cells are still MLC memory cells by the program/erase standpoint, i.e. they are erased as conventional MLC memory cells, but in the program and read phases only the LSB bits (or the MSB bits, depending on the failed memory page) are considered.

Therefore, as visible in FIG. 4B, 3 bits (instead of the 4 bits) are stored in 2 MLC memory cells—i.e., 2 bits in the memory cell Cell 0 (one bit for the memory page 0 and the other bit for the memory page 1) and only one bit in the memory cell Cell 1 (this bit being the unfailed bit associated with the non-failed memory page—i.e. the memory page 2 in the example at issue). This equals to introduce, in the constellation of symbols (logical states) that can be theoretically taken by the memory cells Cell 0 and Cell 1 (and, hence, by all the memory cells of the first and second groups of memory cells, respectively) forbidden symbol combinations (the symbol combinations 1B, 1D, 2A, 2C, 3B, 3D, 4A, 4C in the example at issue), which are graphically identified by solid circles in the figure (the empty circles instead denoting the allowed symbol combinations).

Furthermore, as visible in the figure, the allowed and forbidden symbols pattern is such that:

the allowed symbols include all possible bit combinations of the unfailed bits. For example, when the memory cell Cell 0 has to store the symbol 00, the allowed symbols for the memory cell Cell 1 are such that the respective bits that will be read as unfailed bits (the LSB bits in the example at issue) contain, for a symbol, 0 and, for the other one, 1, so that all the possible combinations of bits that the (SLC) memory cell Cell 1 is able to store can be stored. In the example at issue, the allowed symbols for the memory cell Cell 1 are 10 and 01, although this should not be construed limitatively.

the distance between the allowed symbols is sufficiently high to avoid, or at least substantially reduce, the overlapping regions among the respective threshold voltage distributions (for example, according to said criterion of maximization of distance). As visibly detectable by the graphic representation of FIG. 4B, in the considered example the distance between the allowed symbols is doubled with respect to the scenario illustrated in FIG. 4A, which translates in a reduced extent of the overlapping regions of the respective threshold voltage distributions—and, hence, in a lower expected RBER.

Provision of forbidden symbols (i.e., forbidden symbol combinations) causes a reduction of the storage capability of the SSD device 300 (which is however a lower reduction with respect to the conventional case wherein the whole memory block to which the memory page belongs is marked as failed) but at the benefit of improved RBER and increased SSD device 300 lifetime.

If the RBER overruns the error correction capability of the LDPC decoding unit 360 again (or, as discussed above, after a predetermined number of program/erase cycles), the memory page, among the non-failed memory pages, wherein bit errors (or most of bit errors) have occurred is marked as a failed memory page, and will be no longer considered in the subsequent program/erase cycles.

Figures 4C, 4D:
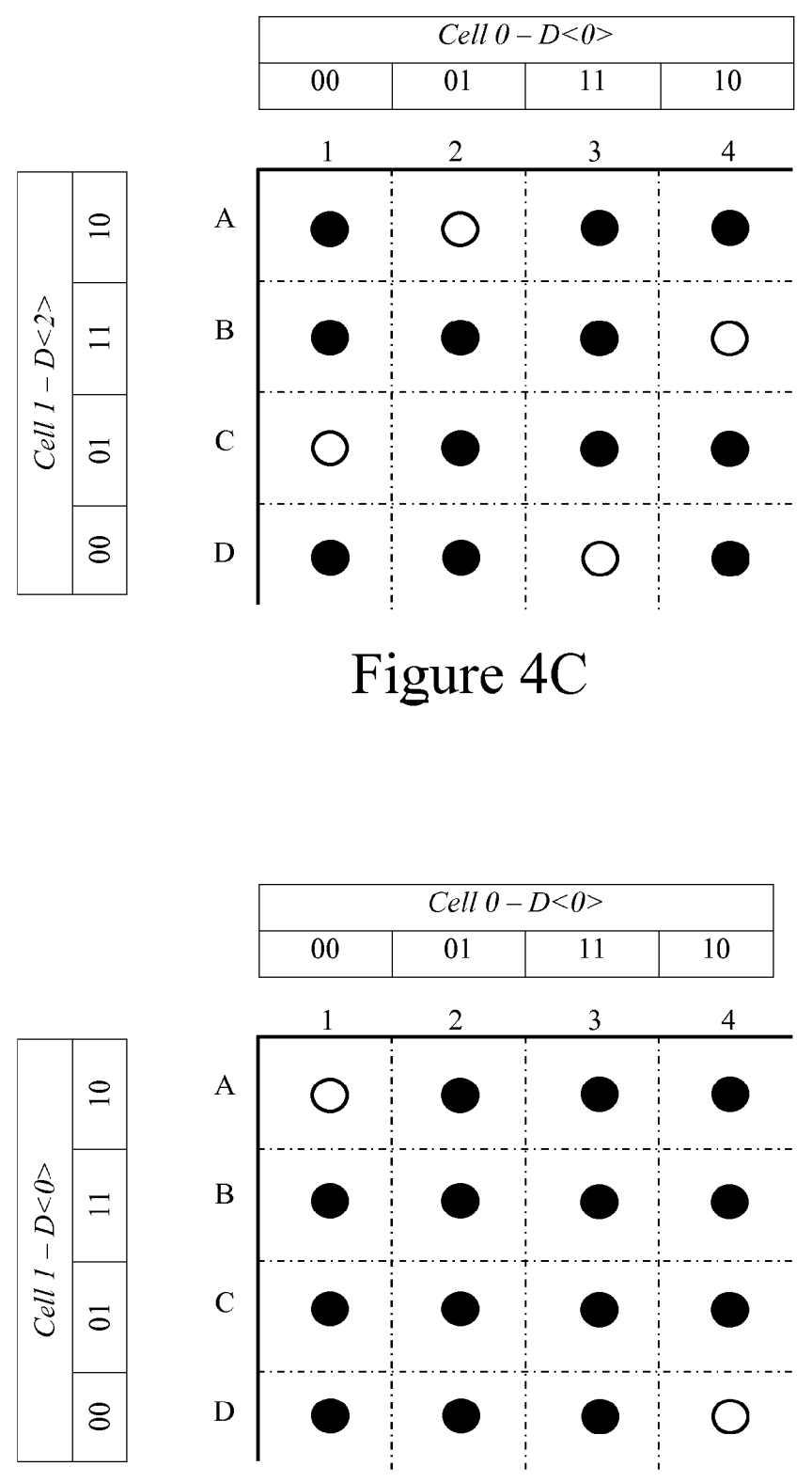

This is shown in FIG. 4C, wherein the memory page 1 (stored in the LSB bits of the group of memory cells including the memory cell Cell 0), which has been assumed to be affected by most of bit errors, has been marked as a failed memory page. Thus, similarly to the above, the group of memory cells associated with the failed memory page (the memory page 1 in the example at issue) is considered available to program/erase cycles only for the respective non-failed memory page (the memory page 0 in the example at issue).

In other words, in the example herein considered of MLC memory cells, the group of memory cells to which the memory cell Cell 0 belongs (as being associated with the failed memory page 1) are dealt as SLC memory cells. Therefore, as visible in FIG. 4C, 2 bits (instead of the 3 bits of the previous case and of the 4 bits of the case even before) are stored in 2 MLC memory cells—i.e., 1 bit in the memory cell Cell 0 (this bit relating to the non-failed memory page 0) and 1 bit in the memory cell Cell 1 (this bit relating to the non-failed memory page 2). This equals to introduce, in the constellation of symbols that can be theoretically taken by the memory cells Cell 0 and Cell 1 (and, hence, by all the memory cells of the first and second groups of memory cells, respectively), further forbidden symbol combinations with respect to the previous case (in the depicted example, the forbidden symbol combinations are 1A, 1B, 1D, 2B, 2C, 2D, 3A, 3B, 3C, 4A, 4C, 4D).

As discussed above, while adding forbidden symbols combinations care should be taken in maximizing distance among the threshold voltage distributions (so as to avoid, or at least reduce as much as possible, the overlapping regions). Indeed, as visibly detectable by the graphic representation of FIG. 4C, the allowed and forbidden symbols pattern is different from that of the previous case, and it is not a mere reduction of the allowed symbol combinations. In fact, only marking as forbidden the symbol combinations 2B, 2D, 4B and 4D (in addition to the forbidden symbol combinations of the previous case) would not result in the highest maximization of distance. In the case illustrated in FIG. 4C, instead, the distance between the allowed symbol combinations is tripled with respect to the scenario illustrated in FIG. 4A, which translates in a reduced extent of the overlapping regions of the respective threshold voltage distributions—and, hence, in a lower expected RBER. As mentioned above, this further reduces the storage capability of the SSD device 300, but at the benefit of improved RBER and increased SSD device 300 lifetime.

Finally, if the RBER overruns the error correction capability of the LDPC decoding unit 360 again (or, as discussed above, after a predetermined number of program/erase cycles), the memory page, among the non-failed memory pages, wherein bit errors (or most of bit errors) have occurred is marked as a failed memory page, and will be no longer considered in the subsequent program/erase cycles.

This is shown in FIG. 4D, wherein the memory page 2 (stored in the LSB bits of the group of memory cells including the memory cell Cell 1, i.e. the second group of memory cells), which has been assumed to be affected by most of bit errors, has been marked as a failed memory page. However, as both memory pages 2 and 3 are failed memory pages, the group of memory cells to which the memory cell Cell 1 belongs (i.e. all the second group of memory cells) may be dealt as SLC memory cells for the memory page 0 (instead of being totally unused).

In this way, as visible in FIG. 4D, 1 bit is stored in 2 MLC memory cells—i.e., 1 bit in the memory cell Cell 0 (this bit relating to the non-failed memory page 0) and 1 bit in the memory cell Cell 1 (this bit relating to the same non-failed memory page 0). This equals to introduce, in the constellation of symbol combinations that can be theoretically taken by the memory cells Cell 0 and Cell 1 (and, hence, by all the memory cells of the first and second groups of memory cells, respectively), further forbidden symbol combinations with respect to the previous case. Similarly to the above, a distance maximization criterion between the threshold voltage distributions is preferably considered, which leads to the illustrated allowed and forbidden symbols pattern. In fact, in the case illustrated in FIG. 4D, the only allowed symbol combinations are 1A and 4D, which translates in a distance among the allowed symbols that is quadrupled with respect to the scenario illustrated in FIG. 4A, and in a further reduced extent of the overlapping regions of the respective threshold voltage distributions—and, hence, in a lower expected RBER. Similarly to the above, this is at the expense of the storage capability of the SSD device 300, but at the benefit of improved RBER and increased SSD device 300 lifetime.

As mentioned above, the spreading scheme applies before (i.e., for) carrying out a write operation—independently from whichever condition requires application of memory page spreading (i.e., RBER overrunning the admitted RBER, excessive computational effort by the LDPC decoding unit 360, and/or occurrence of a predetermined number of program/erase cycles), and independently from how many groups of memory cells are considered.

As far as the read operation is concerned, according to an embodiment of the present invention in such a phase the control unit 325 may continuously check the read symbols output from the de-spreading unit 355 (see arrow connection between the control unit 325 and the de-spreading unit 355 in FIG. 3A), and infer an error of the read operation for those symbols equal to forbidden symbols (or, equivalently, for those symbol combinations equal to forbidden symbol combinations). In response to that, the control unit 325 may:

command further read operations (see arrow connection between the control unit 325 and the memory interface unit 335 in FIG. 3A), for example by moving the reference voltages $V_k$ in a neighborhood thereof (as explained above in connection with FIGS. 2B and 2C), and/or instruct the LDPC decoding unit 360 (see arrow connection between the control unit 325 and the LDPC decoding unit 360 in FIG. 3A) in such a way that the inferred error of the read operation is used by the LDPC decoding unit 360 as an additional input for adaptively correcting the solution (i.e. the information bits decoded from the read symbols). For example, as the LDPC decoding unit 360 operation is based, for each read bit (of each read symbol), on a "Log Likelihood Ratio" (LLR) associated with that bit (indicative of the probability that the read bit is correct), such an additional input provided by the control unit 325 for instructing the LDPC decoding unit 360 about the inferred error may involve zeroing (or at least substantially reducing) the LLR associated with that bit.

Thanks to the memory page spreading (and de-spreading), the lifetime of the SSD device 300 is increased for the same, or even higher, error correction capabilities. Indeed, when applying memory page spreading and de-spreading to consumer (SLC, MLC or TLC) SSD devices, UBER of the order of $10^{-16}$ or less are obtained (by virtue of threshold voltage distribution spacing arising from progressive partial reduction of the memory pages), which is comparable to performance that is expected in enterprise applications. This translates into high reliability and lifetime of the SSD device 300 in terms of sustainable program/erase cycles, as well as in a significant cost reduction for SSD devices for enterprise applications.

Moreover, it is also possible to respond to shortage that typically affect enterprise SSD devices supply chains, as consumer SSD devices, whose availability is always high, may be used with same performance as enterprise SSD devices.

Naturally, in order to satisfy local and specific requirements, a person skilled in the art may apply to the present invention as described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details set forth in the preceding description for providing a more thorough understanding thereof; on the contrary, well-known features may have been omitted or simplified in order not to encumber the description with unnecessary details. Moreover, it is expressly intended that specific elements and/or method steps described in connection with any disclosed embodiment of the invention may be incorporated in any other embodiment.

What is claimed is:

1. A controller for a solid state drive, wherein the solid state drive comprises a plurality of memory cells, wherein each memory cell can store a symbol among a plurality of possible symbols the memory cell is designed to store, wherein each bit of each symbol is associated with a respective memory page, the memory cells being programmed and read simultaneously at memory page level, and wherein the controller comprises:
    a spreading unit configured to:
        mark a memory page whose bit error rate overruns an admitted bit error rate as a failed memory page, each memory page other than a failed memory page defining an unfailed memory page, and
        for a first group of memory cells which are associated with the failed memory page, determine first allowed symbols that are allowed to be stored in the first group of memory cells, said first allowed symbols being a subset of the plurality of the possible symbols such that the bits of the first allowed symbols associated with the unfailed memory pages include all possible bit combinations, and
    a writing unit configured to write information bits into the first group of memory cells according to the first allowed symbols.

2. The controller according to claim 1, wherein each memory cell comprises a floating gate transistor for storing a symbol when programmed with a threshold voltage associated with that symbol, and wherein each threshold voltage is variable over the memory cells of the plurality of memory cells thereby defining a corresponding threshold voltage distribution, said first allowed symbols being further selected according to a criterion of maximization of distance among the respective threshold voltage distributions.

3. The controller according to claim 1, wherein the spreading unit is further configured to determine a plurality of allowed symbol combinations each one comprising, for each first allowed symbol, a second allowed symbol that is allowed to be written in a second group of memory cells when the first allowed symbol is written in the first group of memory cells, and wherein each allowed symbol combination is selected such that the bits of the first and second allowed symbols associated with the unfailed memory pages include all possible bit combinations, the writing unit being configured to write the information bits into the first and second groups of memory cells according to said allowed symbol combinations.

4. The controller according to claim 3, wherein each memory cell comprises a floating gate transistor for storing a symbol when programmed with a threshold voltage associated with that symbol, and wherein each threshold voltage is variable over the memory cells of the plurality of memory cells thereby defining a corresponding threshold voltage distribution, each allowed symbol combination being selected such that said first and second allowed symbols comply with a criterion of maximization of distance among the respective threshold voltage distributions.

5. The controller according to claim 3, wherein said second group of memory cells comprise memory cells potentially disturbing said first group of memory cells.

6. The controller according to claim 3, wherein said second group of memory cells comprise memory cells adjacent said first group of memory cells.

7. The controller according to claim 1, further comprising an encoding unit for encoding the information bits into corresponding encoded bits, said first allowed symbols comprising said encoded bits.

8. The controller according to claim 7, wherein said encoding unit is based on a "Low Density Parity Check" (LDPC) code.

9. The controller according to claim 7, wherein said encoding unit is based on a "Quasi-Cyclic Low Density Parity Check" (QC LDPC) code.

10. The controller according to claim 1, further comprising:
    a de-spreading unit configured to read symbols from the first group of memory cells according to each failed memory page thereof, and
    a control unit configured to command additional reading on the first group of memory cells when at least one read symbol is not among the first allowed symbols.

11. The controller according to claim 1, further comprising:
    a de-spreading unit configured to read symbols from the first group of memory cells according to each failed memory page thereof,
    a decoding unit configured to decode the read symbols into said information bits, and
    a control unit configured to provide, for each bit of each read symbol, an indication about the probability of correctness of that bit based on whether the read symbol is among the first allowed symbols or not, said decoding unit being configured to decode the read bits symbols also based on said indication.

12. The controller according to claim 11, wherein the control unit is further configured to command additional reading on the first group of memory cells when at least one read symbol is not among the first allowed symbols.

13. The controller according to claim 11, wherein said decoding unit is based on a "Low Density Parity Check" (LDPC) code.

14. The controller according to claim 11, wherein said decoding unit is based on a "Quasi-Cyclic Low Density Parity Check" (QC LDPC) code.

15. A solid state drive comprising a plurality of memory cells, wherein each memory cell can store a symbol among a plurality of possible symbols the memory cell is designed to store, wherein each bit of each symbol is associated with a respective memory page, the memory cells being programmed and read simultaneously at memory page level, and wherein the solid state drive comprises:
a spreading unit configured to:
mark a memory page whose bit error rate overruns an admitted bit error rate as a failed memory page, each memory page other than a failed memory page defining an unfailed memory page, and
for a first group of memory cells associated with the failed memory page, determine first allowed symbols that are allowed to be stored in the first group of memory cells, said first allowed symbols being a subset of the plurality of the possible symbols such that the bits of the first allowed symbols associated with the unfailed memory pages include all possible bit combinations, and
a writing unit configured to write information bits into the first group of memory cells according to the first allowed symbols.

16. The solid state drive according to claim 15, wherein each memory cell comprises a floating gate transistor for storing a symbol when programmed with a threshold voltage associated with that symbol, and wherein each threshold voltage is variable over the memory cells of the plurality of memory cells thereby defining a corresponding threshold voltage distribution, said first allowed symbols being further selected according to a criterion of maximization of distance among the respective threshold voltage distributions.

17. The solid state drive according to claim 15, wherein the spreading unit is further configured to determine a plurality of allowed symbol combinations each one comprising, for each first allowed symbol, a second allowed symbol that is allowed to be written in a second group of memory cells when the first allowed symbol is written in the first group of memory cells, and wherein each allowed symbol combination is selected such that the bits of the first and second allowed symbols associated with the unfailed memory pages include all possible bit combinations, the writing unit being configured to write the information bits into the first and second groups of memory cells according to said allowed symbol combinations.

18. The solid state drive according to claim 17, wherein each memory cell comprises a floating gate transistor for storing a symbol when programmed with a threshold voltage associated with that symbol, and wherein each threshold voltage is variable over the memory cells of the plurality of memory cells thereby defining a corresponding threshold voltage distribution, each allowed symbol combination being selected such that said first and second allowed symbols comply with a criterion of maximization of distance among the respective threshold voltage distributions.

19. The solid state drive according to claim 18, wherein said second group of memory cells comprise memory cells potentially disturbing said first group of memory cells.

20. The solid state drive according to claim 18, wherein said second group of memory cells comprise memory cells adjacent said first group of memory cells.

21. The solid state drive according to claim 15, further comprising an encoding unit for encoding the information bits into corresponding encoded bits, said first allowed symbols comprising said encoded bits.

22. The solid state drive according to claim 21, wherein said encoding unit is based on a "Low Density Parity Check" (LDPC) code.

23. The solid state drive according to claim 21, wherein said encoding unit is based on a "Quasi-Cyclic Low Density Parity Check" (QC LDPC) code.

24. The solid state drive according to claim 15, further comprising:
a de-spreading unit configured to read symbols from the first group of memory cells according to each failed memory page thereof, and
a control unit configured to command additional reading on the first group of memory cells when at least one read symbol is not among the first allowed symbols.

25. The solid state drive according to claim 15, further comprising:
a de-spreading unit configured to read symbols from the first group of memory cells according to each failed memory page thereof,
a decoding unit configured to decode the read symbols into said information bits, and
a control unit configured to provide, for each bit of each read symbol, an indication about the probability of correctness of that bit based on whether the read symbol is among the first allowed symbols or not, said decoding unit being configured to decode the read bits symbols also based on said indication.

26. The solid state drive according to claim 25, wherein the control unit is further configured to command additional reading on the first group of memory cells when at least one read symbol is not among the first allowed symbols.

27. The solid state drive according to claim 25, wherein said decoding unit is based on a "Low Density Parity Check" (LDPC) code.

28. The solid state drive according to claim 25, wherein said decoding unit is based on a "Quasi-Cyclic Low Density Parity Check" (QC LDPC) code.

29. The solid state drive according to claim 15, wherein said memory cells are non-volatile memory cells.

30. The solid state drive according to claim 15, wherein said memory cells are flash memory cells.

31. The solid state drive according to claim 15, wherein said memory cells are NAND flash memory cells.

* * * * *